United States Patent [19]

Lee et al.

[11] Patent Number: 5,665,612

[45] Date of Patent: Sep. 9, 1997

[54] METHOD FOR FABRICATING A PLANAR BURIED HETEROSTRUCTURE LASER DIODE

[75] Inventors: Jung-Kee Lee; Dong-Hoon Jang; Jeong-Soo Kim; Kyung-Hyun Park, all of Eoeun-dong, Rep. of Korea

[73] Assignee: Electronics and Telecommunications Research Institute, Rep. of Korea

[21] Appl. No.: 512,224

[22] Filed: Aug. 7, 1995

[30] Foreign Application Priority Data

Aug. 8, 1994 [KR] Rep. of Korea .................. 94-19496

[51] Int. Cl.$^6$ ............................................. H01L 21/265
[52] U.S. Cl. ................................. 438/40; 438/750
[58] Field of Search ..................... 437/22, 23, 126, 437/129, 130, 905

[56] References Cited

U.S. PATENT DOCUMENTS

| 4,994,143 | 2/1991 | Kim ......................... 437/129 |
| 5,093,278 | 3/1992 | Kamei ....................... 437/129 |
| 5,227,015 | 7/1993 | Fujihara et al. .............. 437/129 |
| 5,242,857 | 9/1993 | Cooper et al. ............... 437/129 |
| 5,266,518 | 11/1993 | Binsma et al. .............. 437/129 |
| 5,284,791 | 2/1994 | Sakata et al. ............... 437/126 |
| 5,362,674 | 11/1994 | Okazaki ..................... 437/129 |
| 5,382,543 | 1/1995 | Nakamura et al. ............ 437/905 |

FOREIGN PATENT DOCUMENTS

| 60-154689 | 8/1985 | Japan . |
| 61-150393 | 7/1986 | Japan . |
| 62-159486 | 7/1987 | Japan . |
| 62-200783 | 9/1987 | Japan . |
| 63-169086 | 7/1988 | Japan . |

OTHER PUBLICATIONS

Ohtoshi, Tsukuru et al.: "Analysis of current leakage in InGaAsP/Inp buried heterostructure lasers", pp. 1369–1375, IEEE Journal of Quantum Electronics vol. 25, No. 6, Jun. 1989.

Dutta, Niloy K. et al.: "Analysis of leakage currents in 1.3μm InGaAsP real–index–guided lasers", pp. 201–208; Journal of Lightwave Tech., vol. Lt–2, No. 3, Jun. 1984.

*Primary Examiner*—Kevin Picardat
*Attorney, Agent, or Firm*—Larson and Taylor

[57] ABSTRACT

Disclosed is a method for fabricating a planar buried heterostructure laser diode, comprising the steps of sequentially forming a first clad layer, an undoped active layer and a second clad layer on a substrate so as to complete a first crystal growth; forming a patterned mask layer on the second clad layer; non-selectively etching the second clad layer, the active layer, the first clad layer and the substrate using the mask layer as an etching mask; selectively etching the substrate and the first and second layers; sequentially forming a first and second current blocking layers on a structure formed by the selective etching step so as to complete a second crystal growth; sequentially forming a third clad layer and an ohmic contact layer thereon after removal of the mask layer so as to complete a third crystal growth; and forming a first electrode on a rear surface of the substrate and forming a second electrode on a surface of the third clad layer. By the method, a leakage current induced in an interface between the active layer and the first current blocking layer provided therein can be reduced in proportion to a distance between the active layer and the second current blocking layer formed on the first current blocking layer, and therefore performance of the laser diode can be enhanced.

10 Claims, 5 Drawing Sheets

METHOD FOR FABRICATING A PLANAR BURIED HETEROSTRUCTURE LASER DIODE

BACKGROUND OF THE INVENTION

1. Field of the Invention

The present invention relates to a method for fabricating a laser diode, and more particularly to a method for fabricating a laser diode having planar buried heterostructure capable of modulating at high speed.

2. Description of the Prior Art

Generally, a laser diode, which is capable of modulating at high speed and thereby has been widely used as an optical source for an optical fiber communication, has a buried heterostructure. Such a laser diode having a buried heterostructure has some advantages such as low threshold current, high quantum efficiency, high characteristic temperature and so on. This is because in the laser diode a current blocking layer can be formed on both sides of an active layer formed between two clad layers so as to prevent current-leakage during operation.

FIGS. 1A to 1D shows the process steps for fabricating a conventional planar buried heterostructure laser diode.

Referring to FIG. 1A, on an n-InP substrate 1, a first clad layer 2 of n-InP, an active layer 3 having a multiple quantum well (hereinafter, referred to as "MQW") structure and a second clad layer 4 of p-InP are sequentially formed to complete a first crystal growth. The MQW structure is formed of undoped InGaAs/InGaAsP pairs. In the first crystal growth, the active layer 3 has the MQW structure formed by a metal organic chemical vapor deposition (hereinafter, referred to as "MOCVD").

As shown in FIG. 1B, on the second clad layer 4, a patterned mask layer 5 of $SiO_2$ or $Si_3N_x$ ($x \leq 4$) is formed by a well-known photolithography in the process. Using the mask layer 5 as an etching mask, the second clad layer 4, the active layer 3 and the first clad layer 2 are mesa-etched by an etching solution until the substrate 1 is exposed. In the etching process, a non-selectively etching solution has to be used because InGaAs and InGaAsP constituting the MQW structure of the active layer B are different etching speed in a selective etching solution. Also, the layers 2, 3 and 4 are isotropically removed by a wet etching method, and therefore a round-shaped structure, or a circumferential structure is formed in view of a cross-sectional profile.

In FIG. 1C, around the round-shaped structure, first and second current blocking layers 6 and 7 are formed to complete a second crystal growth. The first current blocking layer 6 is formed of p-InP and the second current blocking layer 7 is formed of n-InP. Also, the current blocking layers are formed by a liquid phase epitaxy (hereinafter, referred to as "LPE") method. Since the current blocking layers 6 and 7 are not grown on the mask layer 5 an upper surface of the second current blocking layer 7 is flat.

With reference to FIG. 1D, after removal of the mask layer 5, a third crystal growth is performed. Then, on the second current blocking layer 7, a third clad layer 8 of p-InP and an ohmic contact layer 9 of p-InGaAs are sequentially formed by the LPE method. Next, an n type electrode 10 is formed on the rear surface of the semiconductor substrate 1 and a p type electrode 11 is formed on a surface of the ohmic contact layer 9.

In the planar buried heterostructure laser diode which is fabricated in accordance with the above described method, a thyristor structure is provided which is constituted by the third clad layer, the second current blocking layer, the first current blocking layer and the substrate. Also, in the above mentioned thyristor structure, the first current blocking layer has to be doped higher in impurity concentration than the p type clad layer and formed relatively thick. The first current blocking layer having a high impurity concentration and a thick thickness, however, is lowered in resistance, and thereby a current can flow sufficiently through the first current blocking layer. Then, a leakage current flows in the interface between the substrate and the first current blocking layer. The leakage current is in proportion to a distance d between the active layer and the second current blocking layer, as shown in FIG. 1D. In order to reduce a leakage current flowing in the interface between the substrate and the first current blocking layer, the distance d has to be determined as short as possible.

However, in order to reduce a leakage current in the thyristor structure, if the first current blocking layer is formed relatively thick, the distance d between the active layer and the second current blocking layer becomes relatively long. This causes a serious problem that the leakage current is increased in the interface between the substrate and the first current blocking layer.

In addition, if the first current intercepting layer is formed relatively thin so as to reduce a leakage current in the interface between the substrate and the first current blocking layer, the distance d between the active layer and second current blocking layer becomes relative short. This causes another serious problem that a leakage current is increased through the thyristor structure.

SUMMARY OF THE INVENTION

It is an object of the present invention to provide a method for fabricating a planar buried heterostructure laser diode in which a leakage current can be reduced in a thyristor structure formed therein and simultaneously a leakage current induced in an interface between a semiconductor substrate and a current blocking layer can be reduced.

According to the aspect of the present invention, the method for fabricating a planar buried heterostructure laser diode, said method comprising the steps of sequentially forming a first clad layer, an undoped active layer and a second clad layer on a substrate so as to complete a first crystal growth; forming a patterned mask layer on the second clad layer; non-selective etching the second clad layer, the active layer, the first clad layer, and the substrate using the mask layer as an etching mask; selective etching of the substrate and the first and second layers; sequentially forming a first and second current blocking layers on a structure formed by the selective etching step so as to complete a second crystal growth; sequentially forming a third clad layer and an ohmic contact layer thereon after removal of the mask layer so as to complete a third crystal growth; and forming a first electrode on a rear surface of the ohmic contact layer and forming a second electrode on a rear surface of the substrate.

In the method, the substrate is formed of InP. The first crystal growth is performed by MOCVD.

In the method, the active layer is formed of MQW structure, each being formed of undoped InGaAs/InGaAsP pairs.

In the method, the non-selective etching step is performed using a non-selective etching solution mixed in the ratio of $HBr:H_3PO_4:K_2Cr_2O_7 = 2:2:1$.

In the method, the second and third crystal growths are performed by LPE or MOCVD.

BRIEF DESCRIPTION OF THE DRAWINGS

This invention may be better understood and its object will become apparent to those skilled in the art by reference to the accompanying drawings as follows.

DESCRIPTION OF THE PREFERRED EMBODIMENT(S)

Figure 1A:
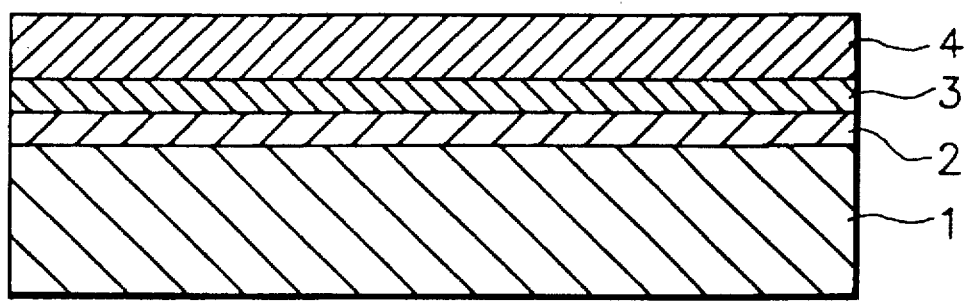
FIGS. 1A to 1D are flow diagrams illustrating by sequential cross-sectional representation the process steps of a conventional method for fabricating a planar buried heterostructure laser diode.
Figure 1B:
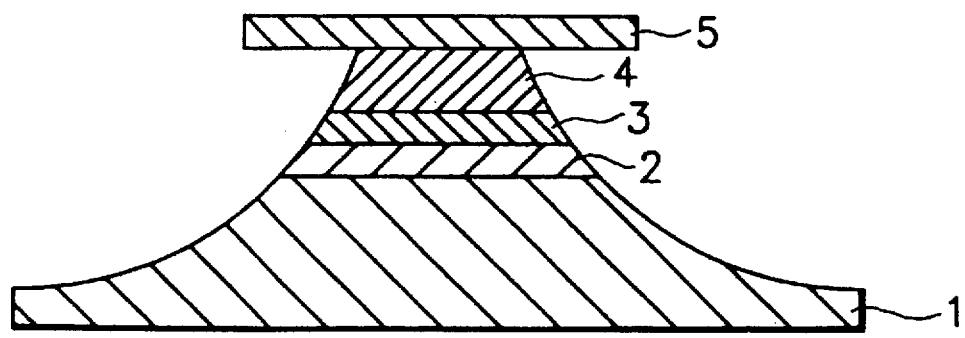
Figure 1C:
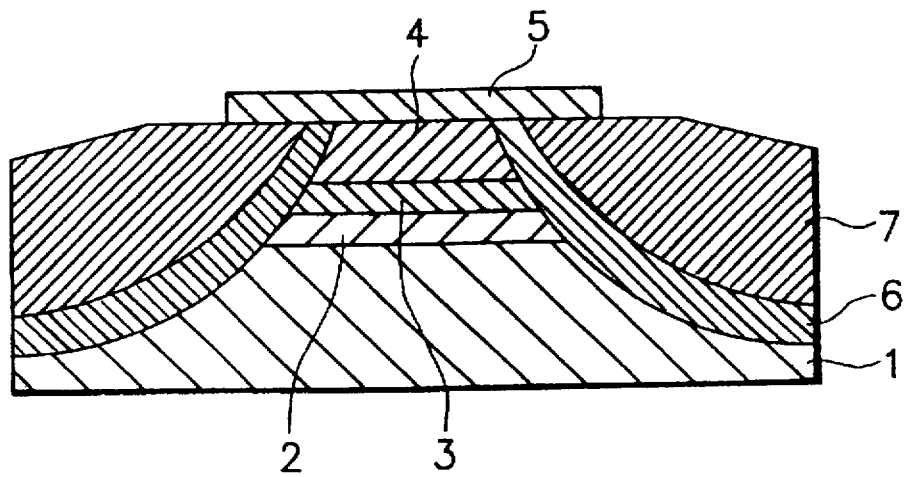
Figure 1D:
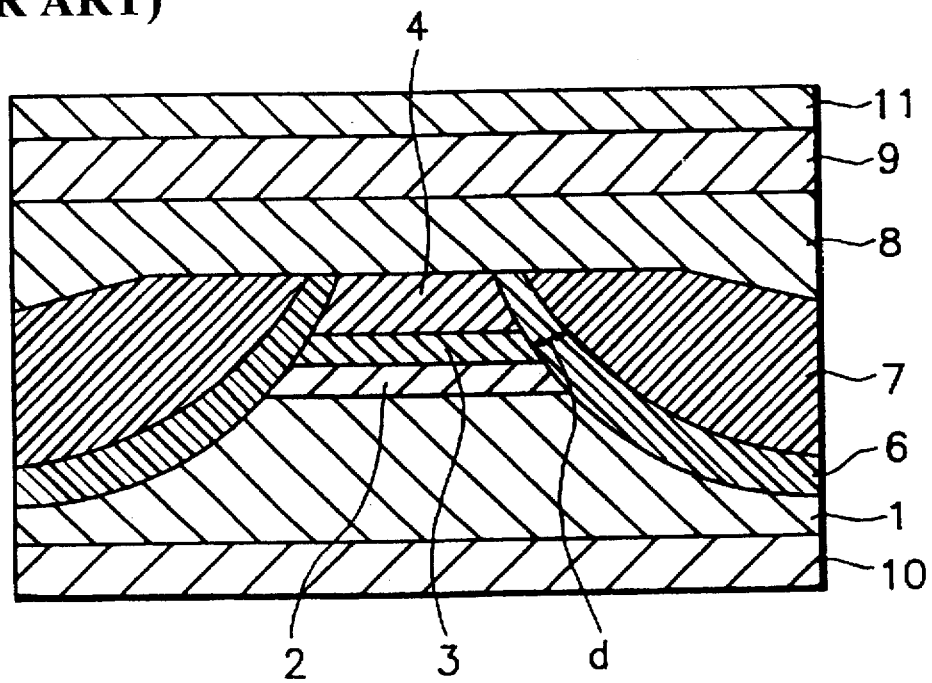
Figure 2A:
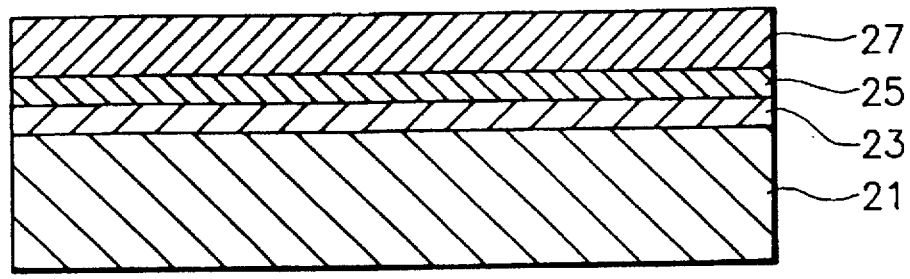
FIGS. 2A to 2E are flow diagrams illustrating by sequential cross-sectional representation the process steps of a novel method for fabricating a planar buried heterostructure laser diode in accordance with the present invention.

Referring to FIG. 2A, on a main surface of an n-InP semiconductor substrate 21, a first clad layer 23 of n-InP, an undoped active layer 25 and a second clad layer 27 of p-InP are sequentially formed to complete a first crystal growth.

In the first crystal growth, the substrate 21 is doped with impurity ions, such as Si and the like, in the range of $3\times10^{18}cm^{-3}\sim5\times10^{18}cm^{-3}$, and the first clad layer 23 is doped with the impurity ions in the range of $1\times10^{18}cm^{-3}\sim3\times10^{18}cm^{-3}$ and has thickness of about 500~1500 Å. The active layer 25 has a MQW structure which is formed of undoped InGaAs/InGaAsP pairs. The MQW structure has thickness of 500~1500 Å. The second clad layer 27 is doped with impurity ions, such as Zn and the like, in the range of $1\times10^{17}cm^{-3}\sim1\times10^{18}cm^{-3}$ and has thickness of about 2000~4000 Å. In the first crystal growth, the MQW structure of the active layer 25 is formed by the MOCVD.

Figure 2B:
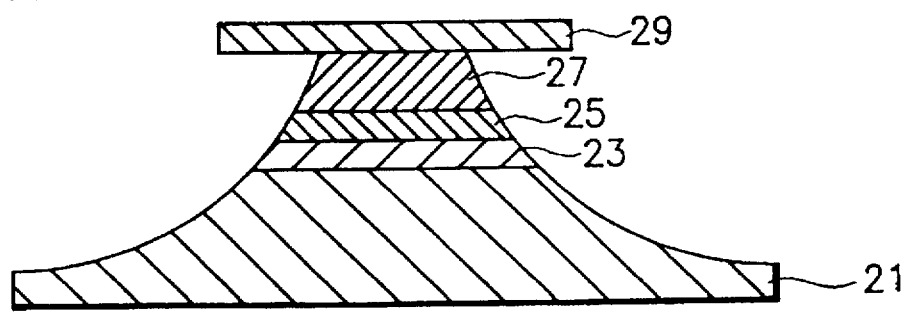

In FIG. 2B, on the second clad layer 27, a patterned mask layer 29 of SiO$_2$ or Si$_3$N$_x$ (x≅4) is formed by the photolithography so as to define the width of the active layer 25. The mask layer 29 has thickness of 1000~3000 Å. Using the mask layer 29 as an etching mask, the second clad layer 27, the active layer 25 and the first clad layer 23 are mesa-etched by an etching solution until the substrate 21 is exposed. In the etching process, a non-selective etching solution mixed in the ratio of HBr:H$_3$PO$_4$:K$_2$Cr$_2$O$_7$=2:2:1 has to be used because InGaAs and InGaAsP constituting the MQW structure of the active layer 25 are different etching speed in a selective etching solution. Also, the layers 27, 25 and 23 are isotropically removed by a wet etching method, and therefore a round-shaped structure, or a circumferential structure is formed in a cross-sectional profile. Thus, a portion in which a crystal surface is not completely exposed occurs in the clad layers 23 and 27.

Figure 2C:
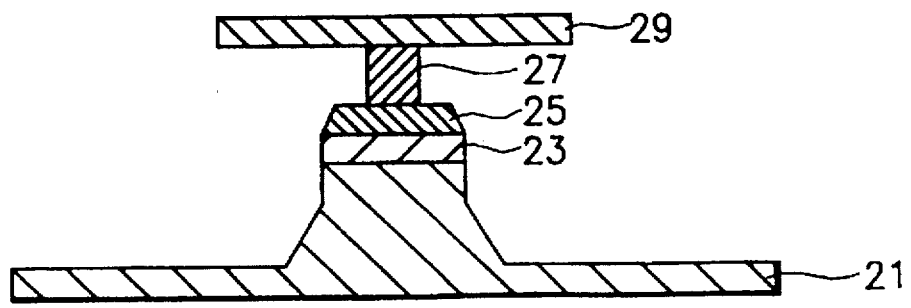

With reference to FIG. 2C, an etching process is performed using a selective etching solution of HCl and H$_3$PO$_4$ mixed in the predetermined ratio so as to selectively remove InP. Then, the substrate 21, the first and second clad layer 23 and 27, which are formed of InP, are selectively etched so that the substrate 21 becomes slanted. However, the first clad layer 23 is vertically etched without undercut it because of crystallization of the active layer 25, and the second clad layer 27 is shorten in width. Then, since the portion is removed in which the crystal surface is not completely exposed, the crystal surface is completely exposed at both sides of each of the clad layers 23 and 27.

Figure 2D:
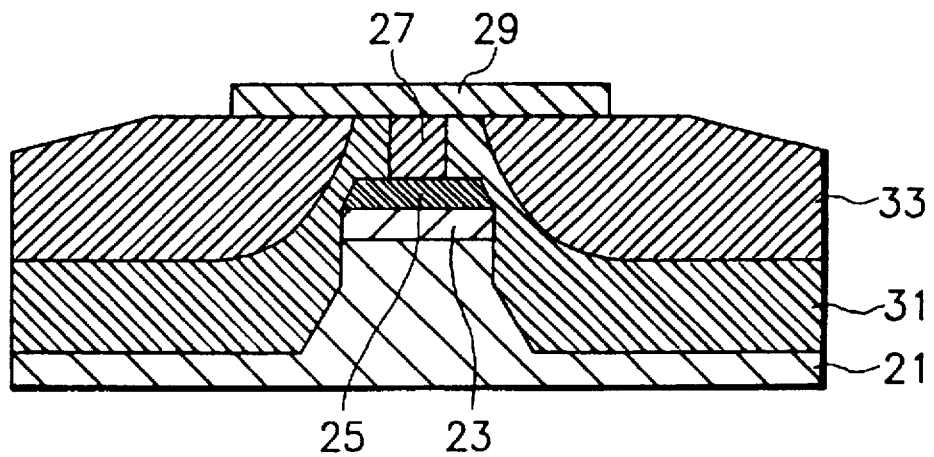

As shown in FIG. 2D, on the structure of FIG. 2C, a first current blocking layer 31 of p-InP and a second current blocking layer 33 of n-InP are sequentially formed using the LPE method or the MOCVD method to complete a second crystal growth. In the second crystal growth, the first current blocking layer 31 is doped with impurity ions, such as Zn and the like, in the range of $1\times10^{18}cm^{-3}\sim3\times10^{18}cm^{-3}$, and the second current blocking layer 33 is doped with impurity ions, such as Te and the like, in the range of $3\times10^{18}cm^{-3}\sim5\times10^{18}cm^{-3}$. Each of the current blocking layers 31 and 33 are in the range of 1.3~1.7 μm in thickness so that a leakage current is lowered in a thyristor provided in the laser diode. As is well-known in the art, the portion in which a crystal surface is not completely exposed is lowered in growing speed, as compared to the portion in which a crystal surface is completely exposed. Thus, the first current blocking layer 31 is formed further thinner on both sides of the active layer 25 than on the exposed portion of the substrate or the exposed portions of the first and second clad layers 23 and 27. The second current blocking layer 33 can be formed plane by the mask layer 29. This is because, during formation of the second current blocking layer 33, growth of a rabbit ear structure can not be prevented from the mask layer 29.

Figure 2E:
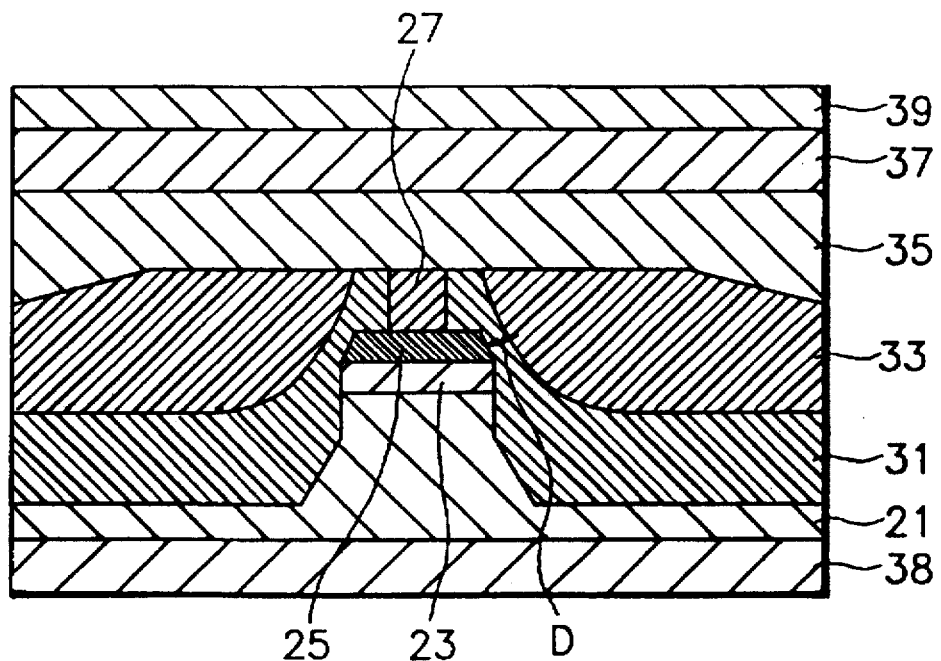

In FIG. 2E, after removal of the mask layer 29, a third crystal growth is performed. Then, on the second clad layer 27 and the first and second current blocking layers 31 and 33, a third clad layer 35 of p-InP and an ohmic contact layer 37 of p-InGaAs are sequentially formed by the LPE or MOCVD method. In the third crystal growth, the third clad layer 35 is doped with impurity ions, such as Zn and the like, in the range of $1\sim\times10^{17}cm^{-3}\sim1\times10^{18}cm^{-3}$ lower in concentration than the first current blocking layer 31, and the ohmic contact layer 37 is doped with the impurity ions in the range of $1\times10^{19}cm^{-3}$ and more. Also, the third clad layer 35 is in the range of 1.3~1.7 μm in thickness and the ohmic contact layer 37 is in the range of 3000~5000 Å in thickness.

Next, a p-type electrode 39 is formed on the a surface of the ohmic contact layer 37 and an n-type electrode 38 is formed on the rear surface of the Semi conductor substrate 21.

Figure 3:
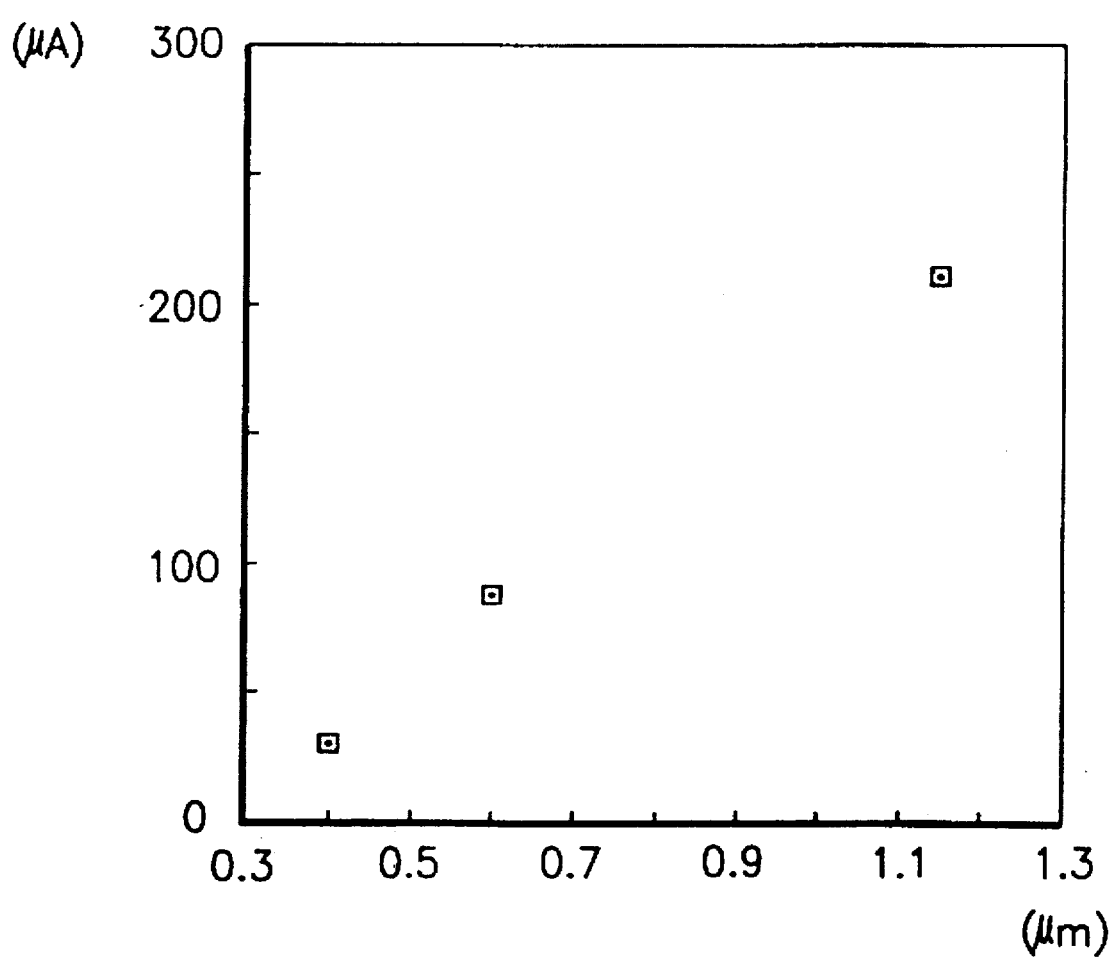
FIG. 3 is a graph diagram showing variation of a leakage current in accordance with a distance between an active layer and a second current blocking layer.

FIG. 3 is a graph diagram showing variation of a leakage current flowing in the interface between the semiconductor substrate 21 and the first current blocking layer 31 in accordance with a distance D between the active layer 25 and the second current intercepting layer 33.

The distance D between the active layer 25 and the second current blocking layer 33 is determined by the thickness of the first current blocking layer 31. It can be understood from FIG. 3 that a reverse leakage current in the interface between the semiconductor substrate 21 and the first current blocking layer 31 is changed in proportion to the distance D.

For example, as shown in FIG. 3, if the distance D is about 1.13 μm, the reverse leakage current is approximately 210 μA. If the distance D is reduced to about 0.6 μm, the reverse leakage current becomes approximately 90 μA.

Further, if the distance is reduced to about 0.4 μm, the reverse leakage current becomes approximately 30 μA. The reverse leakage current of 30 μA can be neglected in the laser diode.

In the planar buried heterostructure laser diode which is fabricated in accordance with the method of the present invention, the second layer, the active layer and the first clad layer constituting a mesa-structure are etched by a non-selective etching solution using a mask pattern as an etching mask, thereby forming a round-shaped structure in a cross-sectional profile. Next, a selective etching process is also performed so that crystal surfaces of the substrate and the first and second clad layers other than the active layer can be completely exposed. In the first and second clad layers and the substrate, a portion exists in which a crystal surface is completely exposed, but in the active layer a portion exists in which a crystal surface is not completely exposed. On the structure etched thus, the first and second current blocking layers are sequentially grown. Then, grown speed of the first current blocking layer is further lower in the active layer than in the first and second clad layers and the substrate. Therefore, the first blocking layer is formed relatively thin on both sides of the active layer, and thereby a distance D between the active layer and the second current blocking layer is reduced.

According to the present invention, a reverse leakage current induced in the interface between an active layer and a first current blocking layer can be reduced in proportion to a distance between the active layer and a second current blocking layer formed on the first current blocking layer, and therefore performance of the laser diode can be enhanced.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be constructed as encompassing all the features of patentable novelty that reside in the present invention, including all features that would be treated as equivalents thereof by those skilled in the art which this invention pertains.

What is claimed is:

1. A method for fabricating a planar buried heterostructure laser diode, said method comprising the steps of:

sequentially forming a first clad layer, an undoped active layer and a second clad layer on an n substrate through a first crystal growth;

forming a patterned mask layer on said second clad layer;

non-selectively etching said second clad layer, said active layer, said first clad layer and said substrate using a non-selective etching solution of InP and said mask layer as an etching mask to form a mesa structure of the laser diode;

selectively etching said substrate and said first and second clad layers using a selective etching solution of InP, to decrease a contact area between said mask layer and said second clad layer and to reduce a distance between said active layer and a second current blocking layer to be formed later;

sequentially forming first and said second current blocking layers on a structure formed by said selective etching step through a second crystal growth;

sequentially forming a third clad layer and an ohmic contact layer thereon after removal of said mask layer through a third crystal growth; and forming a first electrode on a surface of said ohmic contact layer and forming a second electrode on a rear surface of said substrate.

2. The method as defined in claim 1, wherein said first, second and third crystal growths are performed by metal organic chemical vapor deposition (MOCVD), or by liquid phase epitaxy (LPE).

3. The method as defined in claim 1, wherein said active layer is formed of a multiple quantum well structure having undoped InGaAs/InGaAsP pairs.

4. The method as defined in claim 1, wherein said non-selective etching step is performed using a mixed solution of $HBr:H_3PO_4:K_2Cr_2O_7=2:2:1$.

5. The method as defined in claim 1, wherein the selective etching solution used is a mixed solution of $HCl:H_3PO_4$.

6. A method for fabricating a planar buried heterostructure laser diode, said method comprising the steps of:

sequentially forming a first clad layer, an undoped active layer and a second clad layer on an n substrate through a first crystal growth;

forming a patterned mask layer on said second clad layer;

etching said second clad layer, said active layer, said first clad layer and said substrate using said mask layer as an etching mask so as to form a mesa structure in which a portion of the upper surface of said active layer is exposed and so as to form exposed portions of said substrate, of said first clad layer, and of said second clad layer;

sequentially forming a first current blocking layer and a second current blocking layer on a structure formed by said selective etching step through a second crystal growth such that said first current blocking layer is formed thinner on both sides of the active layer than on the exposed portion of said substrate or of the exposed portions of said first and second clad layers, whereby a distance between said active layer and said second current blocking layer is reduced;

sequentially forming a third clad layer and an ohmic contact layer thereon after removal of said mask layer through a third crystal growth; and forming a first electrode on a surface of said ohmic contact layer and forming a second electrode on a rear surface of said substrate.

7. The method as defined in claim 6 wherein said etching step comprises:

non-selectively etching said second clad layer, said active layer, said first clad layer and said substrate using said mask layer as an etching mask so as to form a mesa structure of the laser diode which has a round-shaped structure in a cross-sectional profile; and selectively etching said second clad layer so as to shorten its width and thereby expose an upper surface of said active layer.

8. The method as defined in claim 7 wherein said selective etching step comprises vertically etching said first clad layer without undercutting it.

9. The method as defined in claim 8 wherein said selective etching step further comprises selectively etching said substrate and said first and second clad layers such that said substrate has a slanted configuration in a cross-sectional profile.

10. The method as defined in claim 7 wherein said selective etching step further comprises selectively etching said substrate and said first and second clad layers such that said substrate has a slanted configuration in a cross-sectional profile.

* * * * *